United States Patent
Horng et al.

(10) Patent No.: US 11,094,609 B2
(45) Date of Patent: Aug. 17, 2021

(54) THERMAL DISSIPATION STRUCTURE FOR INTEGRATED CIRCUITS COMPRISING THERMAL DISSIPATION TRENCH

(71) Applicant: NATIONAL CHIAO TUNG UNIVERSITY, Hsinchu (TW)

(72) Inventors: Ray-Hua Horng, Taichung (TW); Po-Chou Pan, Pingtung County (TW)

(73) Assignee: NATIONAL CHIAO TUNG UNIVERSITY, Hsinchu (TW)

( * ) Notice: Subject to any disclaimer, the term of this patent is extended or adjusted under 35 U.S.C. 154(b) by 0 days.

(21) Appl. No.: 16/824,724

(22) Filed: Mar. 20, 2020

(65) Prior Publication Data

US 2021/0013127 A1 Jan. 14, 2021

(30) Foreign Application Priority Data

Jul. 10, 2019 (TW) ................. 108124378

(51) Int. Cl.
 *H01L 23/46* (2006.01)
(52) U.S. Cl.
 CPC .................. *H01L 23/46* (2013.01)
(58) Field of Classification Search
 CPC ...................................... H01L 23/46
 USPC ........................................ 257/712
 See application file for complete search history.

(56) References Cited

U.S. PATENT DOCUMENTS

| | | |
|---|---|---|
| 4,714,107 A | 12/1987 | Adsett |
| 6,517,221 B1 | 2/2003 | Xie |
| 8,794,010 B2 | 8/2014 | Williams et al. |
| 2005/0257912 A1 | 11/2005 | Monty et al. |
| 2006/0131737 A1* | 6/2006 | Im .................. H01L 23/3128 257/717 |
| 2011/0101394 A1* | 5/2011 | McKenzie .............. C23C 28/34 257/98 |
| 2012/0147906 A1 | 6/2012 | Williams et al. |
| 2014/0001604 A1* | 1/2014 | Sadaka ............ H01L 23/49822 257/621 |

(Continued)

FOREIGN PATENT DOCUMENTS

| | | |
|---|---|---|
| CN | 107731767 A | 2/2018 |
| CN | 109411427 A | 3/2019 |

(Continued)

OTHER PUBLICATIONS

D. Mundinger et al., "Demonstration of high-performance silicon microchannel heat exchangers for laser diode array cooling", Appl. Phys. Lett. vol. 53, No. 12, 1988, pp. 1030-1032.

(Continued)

*Primary Examiner* — Ajay Arora
(74) *Attorney, Agent, or Firm* — CKC & Partners Co., LLC

(57) ABSTRACT

A thermal dissipation structure for integrated circuits includes a semiconductor substrate, a thermal dissipation trench, a metal seed layer and a metal layer. The semiconductor substrate has a first surface and a second surface which is opposite to the first surface. Integrated circuits are located on and thermally coupled with the first surface. The thermal dissipation trench is formed within the second surface. The metal seed layer seals the thermal dissipation trench to define a thermal dissipation channel. The thermal dissipation channel includes an inlet and an outlet. The metal layer is an electroplated layer formed from the metal seed layer.

9 Claims, 7 Drawing Sheets

(56) References Cited

U.S. PATENT DOCUMENTS

2017/0110329 A1    4/2017  Carmelo et al.
2018/0062347 A1    3/2018  Hodges et al.

FOREIGN PATENT DOCUMENTS

JP    2003-37223 A    2/2003
TW     200419128 A   10/2004

OTHER PUBLICATIONS

Ray Beach et al., "Modular microchannel cooled heatsinks for high average power laser diode arrays", IEEE Journal of Quantum Electronics (ISSN 0018-9197), vol. 28, No. 4, Apr. 1992, pp. 966-976.

C.J. Ho et al., "An experimental investigation of forced convective cooling performance of a microchannel heat sink with Al2O3/water nanofluid", Applied Thermal Engineering, vol. 30, Issues 2-3, Feb. 2010, pp. 96-103.

\* cited by examiner

THERMAL DISSIPATION STRUCTURE FOR INTEGRATED CIRCUITS COMPRISING THERMAL DISSIPATION TRENCH

RELATED APPLICATIONS

This application claims priority to Taiwan Application Serial Number 108124378, filed Jul. 10, 2019, which are herein incorporated by reference.

BACKGROUND

Field of Disclosure

The present disclosure relates to a thermal dissipation structure for integrated circuits. More particularly, the present disclosure relates to the thermal dissipation of opto-electronic integrated circuits on the semiconductor substrate.

Description of Related Art

As the semiconductor industry moves to the limit of Moore's Law, conventional semiconductor integrated circuits encounter bottlenecks in development. In recent years, one of the solutions is Opto-electronic Integrated Circuit (OEIC), which integrates optical components and integrated circuits. For example, Silicon Photonics provides relatively low cost, while increasing transmission distance, reducing unit energy consumption, and increasing data bandwidth.

Since a large number of optical components and integrated circuits are integrated on a semiconductor substrate, it is important to effectively dissipate the heat generated by optical components (e.g., laser) and integrated circuits. It is necessary to have a heat dissipation structure to remove the heat generated by the laser and avoid the integrated circuit in a short time. Otherwise, when the optical components (e.g., laser integrated into the integrated circuits) operate, the accumulation of heat in the semiconductor substrate causes the integrated circuits to be inoperable in a short time.

SUMMARY

An aspect of the present disclosure is related to a thermal dissipation structure used for integrated circuits.

According to one or more embodiments in the present disclosure, a thermal dissipation structure includes a semiconductor substrate, a thermal dissipation trench, and metal seed layer and a metal layer. The semiconductor substrate has a first surface and a second surface opposite to the first surface. The integrated circuits are located on and thermally coupled with the first surface. The thermal dissipation trench is formed on the second surface and within the semiconductor substrate. The metal seed layer is formed on the second surface. The metal seed layer seals the thermal dissipation trench on the second surface to define a thermal dissipation channel. The thermal dissipation channel includes an inlet and an outlet on a side surface of the semiconductor substrate. The metal layer is an electroplated layer formed from the seed layer.

In one or more embodiments of the present disclosure, the semiconductor substrate includes a silicon on insulator (SOI) substrate. In some embodiments, the SOI substrate includes a silicon layer and an insulating layer. A lower surface of the insulating layer defines the second surface and connected to the metal seed layer. In some embodiments, the thermal dissipation trench is formed within the insulating layer and exposes the silicon layer.

In one or more embodiments of the present disclosure, the thermal dissipation channel has an area on the second surface. The integrated circuits have a vertical projection on the second surface. The vertical projection on the second surface is located in the area of the thermal dissipation channel.

In one or more embodiments of the present disclosure, thermal dissipation channel includes a plurality of hollow channels. The hollow channels are parallel to and communicated to each other. In some embodiment, a width of the inlet or the outlet of the thermal dissipation channel is greater or equal to a width of any of the hollow channels.

In one or more embodiments of the present disclosure, the metal layer includes copper.

In one or more embodiments of the present disclosure, the thermal dissipation structure further includes a pipe group. The pipe group as at least two pipes respectively communicated to the inlet and the outlet to inject the heat transfer fluid into the thermal dissipation channel.

According to one or more embodiments in the present disclosure, a thermal dissipation structure includes a semiconductor substrate, a thermal dissipation trench, and metal seed layer and a metal layer. The semiconductor substrate has a first surface and a second surface opposite to the first surface. The integrated circuits are located on and thermally coupled with the first surface. The thermal dissipation trench is formed on the second surface and within the semiconductor substrate. The metal seed layer is formed on the second surface. The metal seed layer covers the second surface and the thermal dissipation trench of the semiconductor substrate. The metal layer is an electroplated layer formed from the metal seed layer. The thermal dissipation trench is filled with the metal seed layer and the metal layer.

In summary, according to one or more embodiments of the present disclosure, the thermal dissipation structure is within the semiconductor substrate with integrated circuits to define a thermal dissipation channel, and the distance between the integrated circuits and the thermal dissipation channel is minimized. The heat transfer fluid can flow through the heat dissipation channel, so that the heat of the integrated circuit can be transferred to the heat transfer fluid. When the heat transfer fluid flows, the metal seed layer and the metal layer are connected to the heat transfer fluid to further transfer the heat. Both of the material of the metal seed layer and the metal layer are metal with good thermal conductivity. The heat transfer efficiency of the thermal dissipation structure can be further effectively improved. In addition, in one embodiment of the present disclosure, a metal with good thermal conductivity can be directly configured into the thermal dissipation channel.

BRIEF DESCRIPTION OF THE DRAWINGS

The advantages of the present disclosure are to be understood by the following exemplary embodiments and with reference to the attached drawings. The illustrations of the drawings are merely exemplary embodiments and are not to be considered as limiting the scope of the present disclosure.

DETAILED DESCRIPTION

The following embodiments are disclosed with accompanying diagrams for detailed description. For illustration clarity, many details of practice are explained in the following descriptions. However, it should be understood that these details of practice do not intend to limit the present invention. That is, these details of practice are not necessary in parts of embodiments of the present invention. Furthermore, for simplifying the drawings, some of the conventional structures and elements are shown with schematic illustrations. Also, the same labels may be regarded as the corresponding components in the different drawings unless otherwise indicated. The drawings are drawn to clearly illustrate the connection between the various components in the embodiments, and are not intended to depict the actual sizes of the components.

As used herein, the terms "comprising," "including," "having," "containing," "involving," and the like are to be understood to be open-ended, i.e., to mean including but not limited to.

Opto-electronic integrated circuits (OEIC) are to integrate optical components and integrated circuits in a single substrate. Therefore, the total space occupied by the total system with optical components and integrated circuits is minimized.

Through the optical coupling between the opto-electric components to the opto-electric components, opto-electric integrated circuits have some advantage compared with the conventional integrated circuits. For example, the electric signal transmission is through copper circuits. As the size of the integrated circuits is reduced, the electrical signal transmission of the copper wire is physically limited by the difficulty. In the opto-electronic integrated circuit, photons are used as carriers for transmitting signals, so that the signal transmission speed can be greatly increased.

However, the opto-electronic components integrated in the optoelectronic integrated circuit may generate more heat than the components in the conventional integrated circuit. For example, an opto-electronic component element integrated in an optoelectronic integrated circuit is a laser device. Therefore, for an opto-electronic integrated circuit in which integrated circuits and opto-electronic components are on the same semiconductor substrate, one or more embodiments in the present disclosure provides a thermal dissipation structure directly configured in the semiconductor substrate to solve the heat dissipation problem of the opto-electronic integrated circuit at a close distance.

Figure 1:
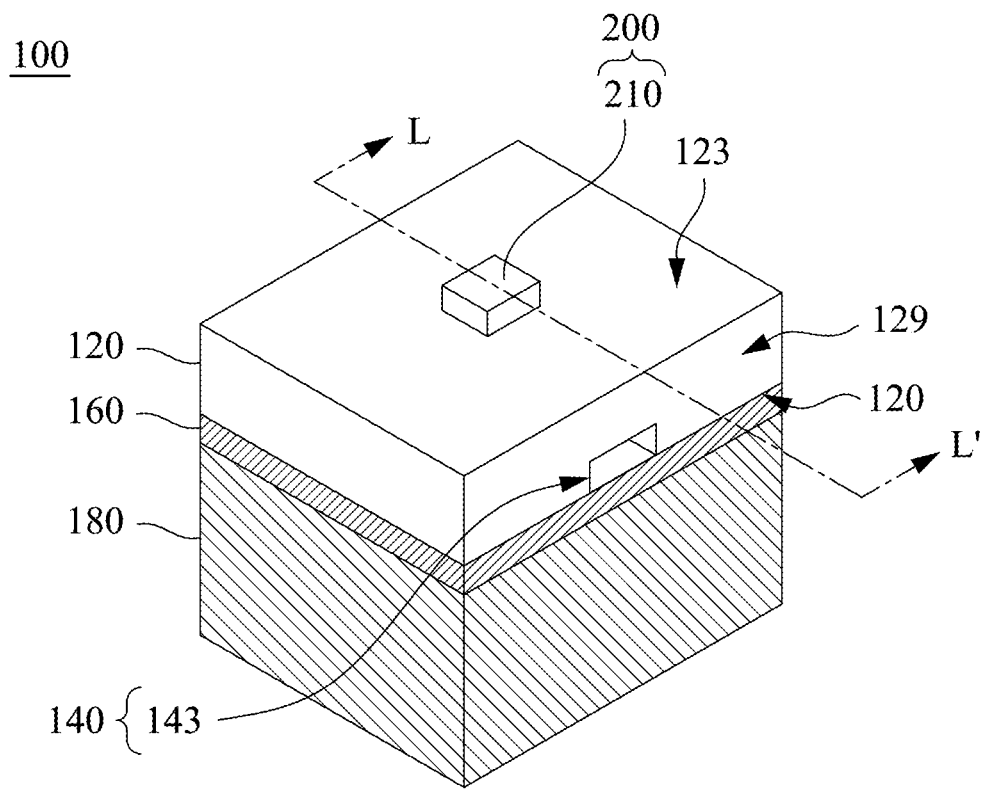
FIG. 1 illustrates a schematic perspective view of a thermal dissipation structure according to one or more embodiment of the present disclosure.

FIG. 1 illustrates a schematic perspective view of a thermal dissipation structure 100 according to one or more embodiment of the present disclosure. The thermal dissipation structure 100 is used for integrated circuits (e.g., opto-electric integrated circuit 200 discussed below). As shown in FIG. 1, the thermal dissipation structure 100 includes a semiconductor substrate 120, a thermal dissipation trench, a metal seed layer 160 and a metal layer 180. The semiconductor substrate 120 includes a first surface 123, a second surface 126 and a side surface connected to the first surface 123 and the second surface 126. The thermal trench is formed on the second surface 126 and within the semiconductor substrate 120. The metal seed layer 160 is connected to the second surface 126 of the semiconductor substrate 120. In this embodiment, the metal seed layer is directly connected to the second surface 126. The metal seed layer 160 seals the thermal dissipation trench on the second surface 126 to define a thermal dissipation channel 140. The thermal dissipation channel includes an inlet 143 located on the side surface 129 of the semiconductor substrate 129. The metal layer 180 is formed from the metal seed layer 160, and the metal layer 180 is formed below the metal seed layer 160 in FIG. 1. The metal layer 180 is connected to the metal seed layer 160. Further, the thermal dissipation structure 100 includes heat transfer fluid 190 (discussed below). When the thermal dissipation structure 100 operates, the heat transfer fluid 190 flows into the thermal dissipation channel 140 through the inlet 143. Because of the direct connection between the heat transfer fluid 190 and the metal seed layer 160, the heat accumulated in the semiconductor substrate 120 can be conducted to the metal seed layer 160 by the heat transfer fluid 190, and then the heat is conducted to the metal layer 180 through the metal seed layer 160.

As shown in FIG. 1, the integrated circuit is configured on the semiconductor substrate 120. In this embodiment, an opto-electric integrated circuit 200 is configured on the first surface 123 of the semiconductor substrate 120. In some embodiments, the semiconductor substrate 120 includes a silicon substrate. The opto-electric integrated circuits 200 include an opto-electric component 210. To clearly illustrate the design of the thermal dissipation structure 100, the opto-electronic integrated circuit 200 is schematically presented by the opto-electric component 210. In some embodiments, the opto-electric integrated circuits can have more opto-electric components 210 and integrated circuit. In some embodiments, the integrated circuits for controlling the opto-electric component 210 can be directly formed on the first surface 123 of the semiconductor substrate 120, and then the opto-electric component 210 can be configured on the first surface 123 and connected to the integrated circuit.

Specifically, in some embodiments, the semiconductor substrate 120 is a silicon substrate. The silicon integrated circuit can be formed on the first surface 123 by a conventional semiconductor fabrication process. The silicon integrated circuits can include silicon transistors and conductive wires for connecting. The opto-electronic component 210 is then placed in the layout of the silicon integrated circuit to implement the silicon opto-electric integrated circuit system. The material of the semiconductor substrate 120 can include other semiconductor material beyond silicon. In some embodiments, the opto-electric components 210 include Vertical-Cavity Surface-Emitting Laser (VCSEL) and Edge Laser. In some embodiments, the opto-electric components 120 can be attached to the first surface 123 by silver glue. In some embodiments, the opto-electric components 120 can be bonded on the first surface 123 by gold or tin plating.

Figure 2:
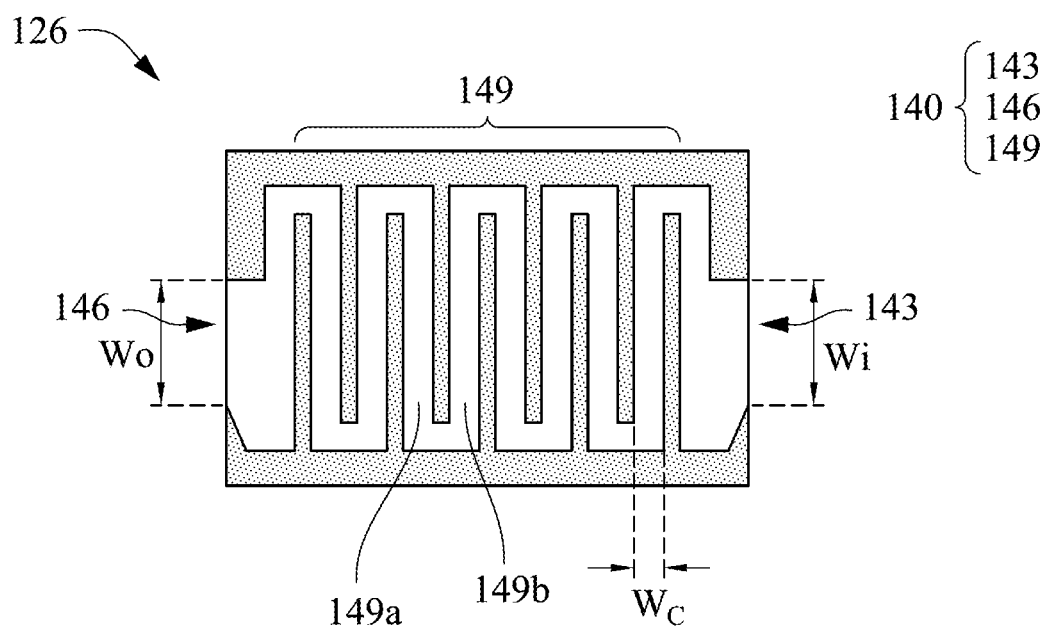
FIG. 2 illustrates a schematic view a second surface of the semiconductor substrate in FIG. 1.

FIG. 2 illustrates a schematic view a second surface 126 of the semiconductor substrate 120 in FIG. 1. Also refer to FIG. 1 and FIG. 2 to illustrate the thermal dissipation channel 140. As described above, the thermal dissipation channel 140 is formed by the thermal dissipation trench with the second surface 120 and the metal seed layer 160, and the metal seed layer 160 seals the thermal dissipation trench. That is, trench portions of the thermal dissipation channel 140 are concave from the second surface 126 of the semiconductor substrate 120. In some embodiments, with the minimized integral circuits, the trench portions of the thermal dissipation channel (thermal dissipation trench) are formed by a semiconductor patterning process. Therefore, the trench portions can be with considerable fineness. Specifically, the trench portions of the thermal dissipation channel can include bottoms which respectively at different heights, and the thermal dissipation channel can even have more complex three-dimensional undulations. In this embodiment, the trench portions of the thermal dissipation channel are with a zigzag arrangement. To clearly illustrate the structure of the thermal dissipation channel 140, only the trench portions of the thermal dissipation channel 140 within the second surface 126 is shown in FIG. 2 is exposed, and the trench portions are exposed from the second surface 126.

As shown in FIG. 2, except for the inlet 143 shown in FIG. 1, the trench portions of the thermal dissipation channel 140 further include an outlet 146 and a main channel 149, and the main channel 149 connects the inlet 143 and the outlet 146. The inlet 143 and the outlet 146 are respectively located at different positions on the side surface 129 of the semiconductor substrate 120. Also refer to FIG. 1 and FIG. 2, in this embodiment, the inlet 143 and the outlet 146 are respectively located at two opposite side of the side surface 129 of the semiconductor substrate 120 but not limited to the present disclosure.

In FIG. 2, the main channel 149 of the thermal dissipation channel 140 connects the inlet 143 and the outlet 146. In this embodiment, the main channel 149 of the thermal dissipation channel 140 includes a plurality of hollow channels, and the hollow channels arrange in a zigzag structure. The hollow channels 149a and 149b shown on FIG. 2 are in parallel, and one end of the channel portion 149a is connected to one end of the channel portion 149b. Therefore, the thermal dissipation channel 140 can be uniformly distributed over the second surface 126. It should be understood that the thermal dissipation channel 140 shown in FIG. 2 is an example but not limited the present disclosure.

In this embodiment, as shown in FIG. 2, the inlet 143 and the outlet 146 are on the side surface 129, the inlet 143 has a width Wi, the outlet 146 has a width Wo, and a channel portion of the main channel 149 has a width Wc. In general, in order to achieve a more dense distribution of the channel portion, the width Wc is reduced, and a larger area of the hollow channels can be distributed on the second surface 126. In some embodiments, the main channel 149 can be form by a patterning process, and the width Wc can be determined by the fineness of the patterning process. The inlet 143 and the outlet 146 are respectively connected to pipes, and the heat transfer fluid can be injected to the thermal dissipation channel 140 through the pipes (discussed below). For the connection of the pipes and the thermal dissipation channel 140, the inlet 143 and the outlet 146 respectively have width Wi and Wo greater than the width Wc of one of the hollow channels.

Figure 3A:
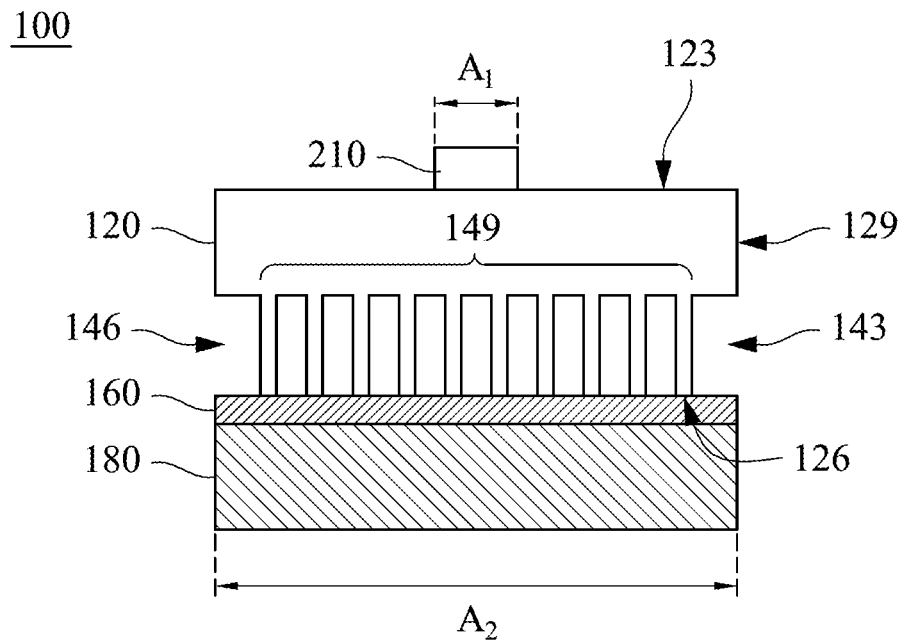
FIG. 3A illustrates a schematic cross section of the thermal dissipation structure long line L-L.

FIG. 3A illustrates a schematic cross section of the thermal dissipation structure 100 along line L-L. The similar components of the thermal dissipation structure 100 will not be repeated. As illustrated in FIG. 3A, the opto-electric component 210 of the opto-electronic integrated circuit 200 is located on the first surface 123. The opto-electric component 210 has a projected area $A_1$ on the second surface 126. The thermal dissipation channel 140 has an area $A_2$ covered by the second surface 126. The area $A_1$ is smaller than area $A_2$. Thus, the projected area $A_1$ of the opto-electric component 210 on the second surface 126 is within the area $A_2$ of the thermal dissipation channel 140 that is covered by the second surface 126. Therefore, it can be ensured that the thermal dissipation channel 140 cools the opto-electronic integrated circuit 200 when the opto-electronic integrated circuit 200 operates. It should be understood that, for simplicity of description in the present disclosure, the opto-electronic integrated circuit 200 is simply presented by opto-electric component 210. In some embodiments, the opto-electronic integrated circuit 200 can include other semiconductor elements and opto-electric component and have large projected area $A_1$, and in the present disclosure, the area $A_1$ is always within the area $A_2$ to ensure that the thermal dissipation structure 100 functions to dissipate heat.

Figure 3B:
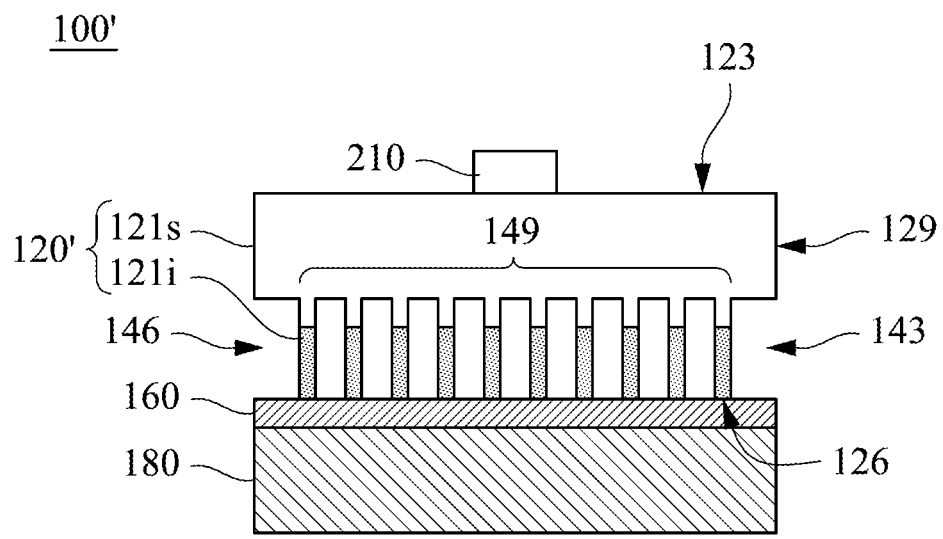
FIG. 3B illustrates a schematic cross section of a thermal dissipation structure according to other embodiments of the present disclosure.

FIG. 3B illustrates a schematic cross section of a thermal dissipation structure 100' according to other embodiments of the present disclosure. The difference between FIG. 3A and FIG. 3B is that the semiconductor substrate used is a silicon on insulator substrate 120'. In the field of semiconductor technology, the silicon on insulator (SOI) technology is to provide an additional insulating layer on the pure silicon semiconductor substrate, so that the parasitic capacitance of the subsequently formed transistor is reduced. In the present disclosure, the silicon on insulator substrate 120' can also be used as the semiconductor substrate, and FIG. 3B illustrates one of the embodiments. In FIG. 3B, the silicon on insulator substrate 120' includes a silicon layer 121s and an insulating layer 121i. Since the first surface 123 is provided with the opto-electric component 210, the silicon layer 121s is located on the insulating layer 121i, and the first surface 123 is located on the silicon layer 121s. The second surface 126 is defined by a low surface of the insulating layer 121i. Thus, the second surface 126 is located on the insulating layer 121i and connected to the metal seed layer 160. In some embodiments, the material of the insulating layer 121i is, for example, silicon oxide ($SiO_2$). Since silicon oxide is a poor heat conductive material, as shown in FIG. 3B, the thermal dissipation channel 140 is formed within the insulating layer 121i, and the silicon layer 121s exposes the thermal dissipation channel 140. In some practical cases, in addition to the silicon layer 121s and the insulating layer 121i, the silicon on insulator substrate 120' can have a silicon bottom plate (not shown) for supporting the silicon layer 121s and the insulating layer 121i. Exist of the silicon bottom plate is depended on the thinning process of the subsequent semiconductor substrate. The silicon bottom plate can be completely removed or partially deposited on the silicon on insulator substrate 120'. It should be understood that although the present disclosure is exemplified by a silicon on insulator substrate 120', other similar semiconductor-on-insulator substrates can also be applied to the present disclosure.

Figure 4A:
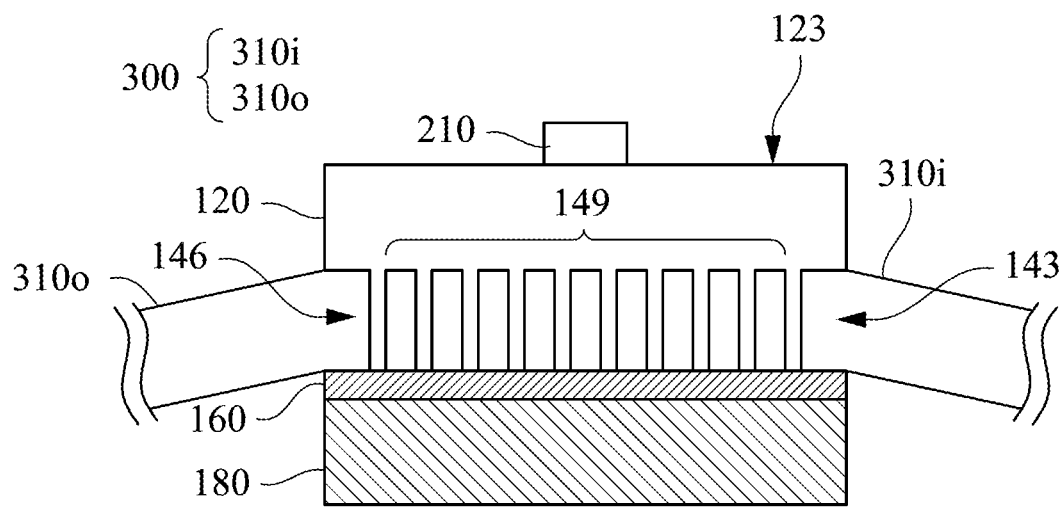
FIG. 4A illustrates that the thermal dissipation structure in FIG. 3A is connected to an external pipe group.
Figure 4B:
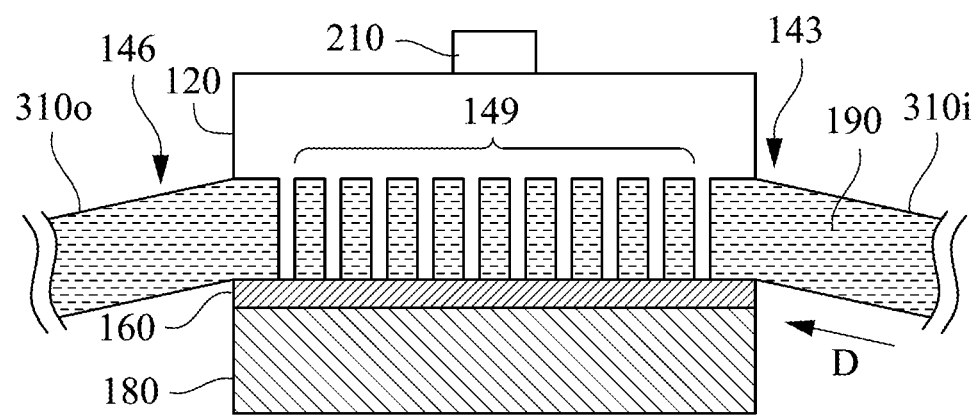
FIG. 4B illustrates that the heat transfer fluid from the external pipe group flows into the thermal dissipation channel.

FIG. 4A illustrates that the thermal dissipation structure 100 in FIG. 3A is connected to an external pipe group 300. FIG. 4B illustrates that the heat transfer fluid 190 from the external pipe group 300 flows into the thermal dissipation channel 140. According to FIG. 4A and FIG. 4B, the operation mode of the thermal dissipation structure 100 and the use of the metal seed layer 160 and the metal layer 180 are specifically described.

Please refer to FIG. 2 and FIG. 4A. As discussed above, the inlet 143 and the outlet 146 of the thermal dissipation channel 140 respectively have a width Wi and a width Wo. The inlet 143 is connected to a pipe 310i of the pipe group 300, and the outlet 146 is connected to the pipe 310*o* of the pipe group 300. In this embodiment, the width Wi is designed to match the size of the pipe 310*i*, and the width Wo is designed to match the size of the pipe 310*o*.

In FIG. 4B, the heat transfer fluid 190 is injected into the thermal dissipation channel 140 from the inlet 143 through the pipe 310*i*, and the heat transfer fluid 190 flows out from the outlet 146 through the pipe 310*o*. The heat transfer fluid 190 can be injected by, for example, connecting the pipe 310*i* to a pump and injecting the heat transfer fluid 190 with an external force. In this embodiment, when the thermal dissipation structure 100 operates, the heat transfer fluid 190 is injected from the inlet 143 without interruption and flows along a direction D in the thermal dissipation channel 140. In this embodiment, the inlet 143 and the outlet 146 are respectively located on opposite sides of the side 129 of the semiconductor substrate 120. In some embodiments, the inlet 143 and the outlet 146 can be located on the same side of the side 129, and are also included in the present disclosure in the case where the heat transfer fluid 190 is injected from the inlet 143 and flows out of the outlet 146. Therefore, the thermal dissipation structure 100 is used as a water cooling system integrated into the semiconductor substrate 120, and the heat is removed by the uninterrupted flow of the heat transfer fluid 190.

Please refer to FIG. 4B. When the opto-electric component 210 operates, the heat generated by the opto-electric component 210 is transferred from the first surface 123 to the thermal dissipation channel 140 within the second surface 126. At this point, the heat will be transferred to the heat transfer fluid 190. Since the heat transfer fluid 190 flows out of the outlet 146 without interruption from the inlet 143, the heat transfer fluid 190 remains at a lower temperature to continue receiving the heat generated by opto-electric component 210, and the heat is carried out of the semiconductor substrate 120 by the flow of the heat transfer fluid 190. In addition, the heat transfer fluid 190 contacts the metal seed layer 160, and the metal layer 180 connects the metal seed layer 160. The metal seed layer 160 and the metal layer 180 are both thermally conductive metals, and thus can also carry away heat in the heat transfer fluid 190. The metal seed layer 160 is used to connect the metal layer 180 and the thermal dissipation channel 140. In some embodiments, the material of the metal layer 180 includes copper. Copper has good thermal conductivity, and is inexpensive, but the disclosure is not limited thereto.

In this embodiment, deionized water is used as the heat transfer fluid 190, so there is no doubt about current leakage, but the disclosure is not limited thereto. In some embodiments, the heat transfer fluid 190 can include other liquids or gases that are thermally conductive. It should be understood that if a gas is used as the heat transfer fluid 190, the heat dissipation channel 140 should be designed to withstand the pressure change caused by the injection of gas.

FIGS. 5A-5G respectively illustrate cross sections in the various process for manufacturing a thermal dissipation structure according one embodiment of the present disclosure.

Figure 5A:
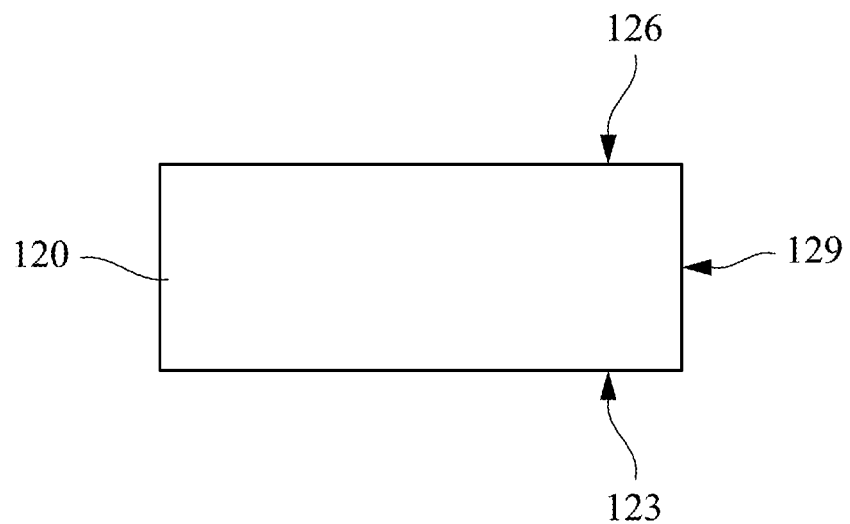
FIGS. 5A-5G respectively illustrate cross sections in the various process for manufacturing a thermal dissipation structure according one embodiment of the present disclosure.

In FIG. 5A, a semiconductor substrate 120 is provided. The semiconductor substrate 120 includes a first surface 123, a second surface 126, a side surface 129 connecting the first surface 123 and the second surface 126, and the second surface 126 faces upward to facilitate subsequent generation of the thermal dissipation channel 140 on the second surface 126. For the purpose of heat dissipation, the semiconductor substrate 120 can be thinned through a thinning process, and the thickness of the semiconductor substrate 120 is reduced.

Therefore, the path length required for the heat to be transferred from the first surface 123 to the second surface 126 is shortened. In some embodiments, as previously described, the semiconductor substrate 120 can be a silicon on insulator substrate comprising a silicon layer and an additional insulating layer, and the first surface 123 can be located on the silicon layer.

Figure 5B:
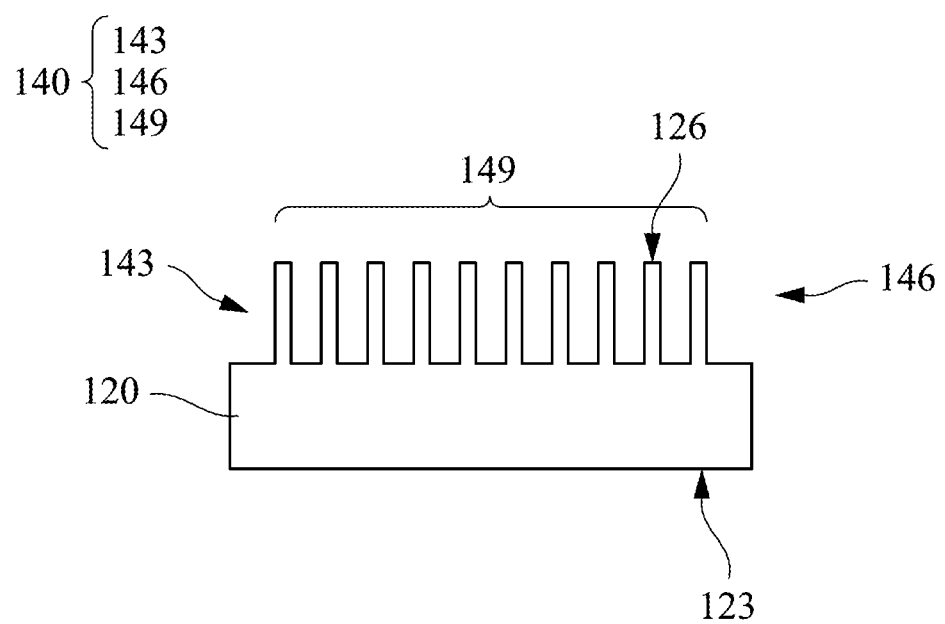

FIG. 5B continues with FIG. 5A. On the second surface 126 of the semiconductor substrate 120, a recessed thermal dissipation trench, that is, a trench portion of the thermal dissipation channel 140 on the second surface 126 is formed. The thermal dissipation channel 140 includes an inlet 143, an outlet 146, and a main channel 149 that communicates the inlet 143 and the outlet 146. Please refer to FIG. 2 illustrating a specific structure of the thermal dissipation channel 140. In order to have a better thermal coupling with the subsequent integrated circuit generating heat, the trench portion of the thermal dissipation channel 140 must be made finer and can have a finer distribution. In one or more embodiments of the present disclosure, the trench portion of the thermal dissipation channel 140 is formed by a patterning process in semiconductor technology.

Figure 5C:
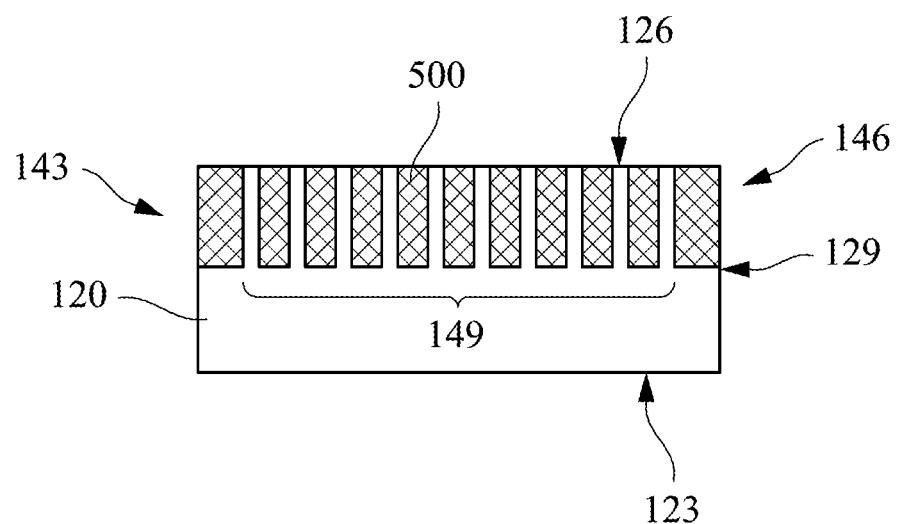

FIG. 5C continues with FIG. 5B. A photoresist 500 is filled in the trench portion of the formed thermal dissipation channel 140. The purpose of using the photoresist 500 is to further form other structures on the second surface 126, and to remove the photoresist 500 with a chemical solvent after the structure is formed. The chemical solvent is, for example, acetone. Those skilled in the relevant art can change the photoresist 500 to other materials having similar functions, depending on the actual situation.

Figure 5D:
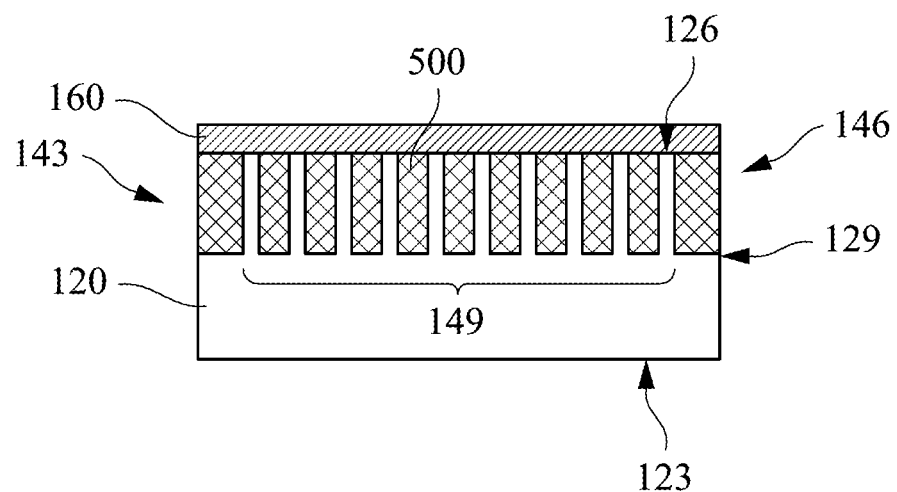

FIG. 5D continues with FIG. 5C. A metal seed layer 160 is formed over the second surface 126 of the semiconductor substrate 120 and the photoresist 500. In some embodiments, the metal seed layer 160 is formed over the second surface 126 by adhesion. In some embodiments, the metal seed layer 160 can also be formed over the second surface 126 using a deposition process.

The metal seed layer 160 is used to connect thermally conductive material to the second surface 126 of the semiconductor substrate 120 and further seal the trench portion of the thermal dissipation channel 140 within the second surface. It avoids the undesired outflow of the heat transfer fluid 190 disposed in the thermal dissipation channel 140 after the photoresist 500 is removed. As mentioned above, in some embodiments, the trench portion of the thermal dissipation channel 140 has a relatively intensive distribution, and it is necessary to use the metal seed layer 160 in order to prevent large damage to the generated trench portion. A subsequent metal material for heat conduction is attached to the second surface 126. The metal material having good thermal conductivity is, for example, copper. In some embodiments, the material of the metal seed layer 160 comprises titanium, chromium or gold, but the disclosure is not limited thereto.

Figure 5E:
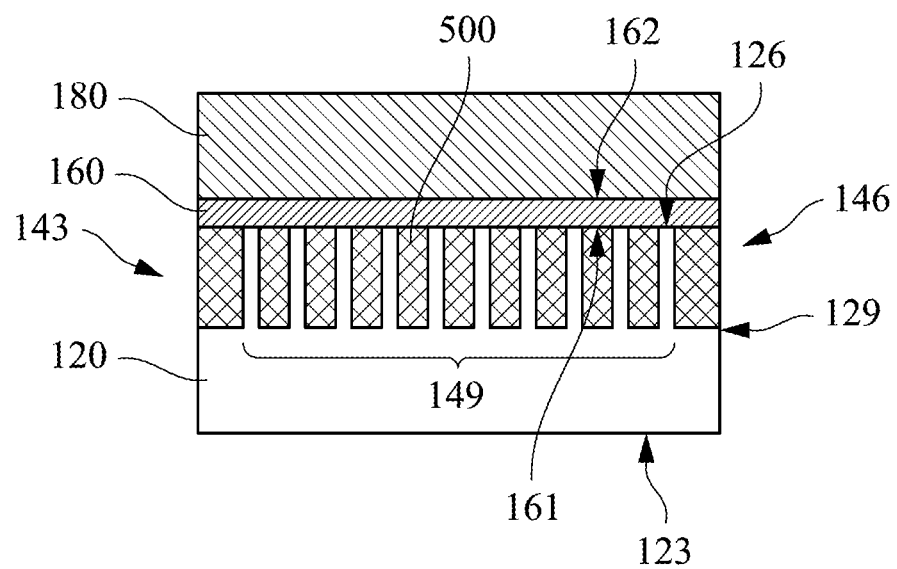

FIG. 5E continues with FIG. 5D. A metal layer 180 is formed on the metal seed layer 160. In some embodiments, the metal layer 180 is formed on the metal seed layer 160 by a plating process. Since the metal seed layer 160 is a metal, the metal layer 180 can be easily plated over the metal seed layer 160 to connect the second surface 126 of the semiconductor substrate 120 without damaging the trench portion of the thermal dissipation channel 140.

Figure 5F:
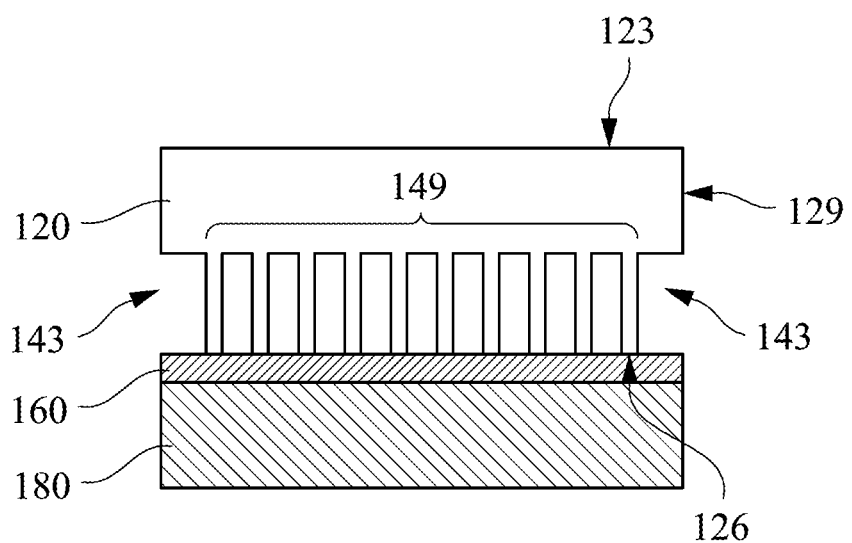

FIG. 5F continues with FIG. 5E. After the metal layer 180 is formed, the photoresist 500 is removed. Thus, the inlet 143 is communicated with the outlet 146, and the first surface 123 of the semiconductor substrate 120 is turned up so as to subsequently form the opto-electric component 210 on the first surface 123.

Figure 5G:
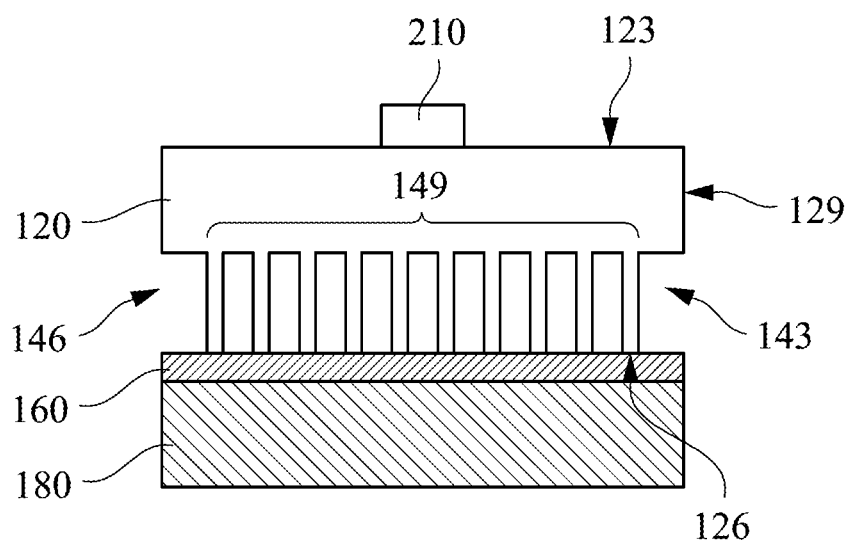

FIG. 5G continues with FIG. 5F. The opto-electric component 210 is configured over the first surface 123 of the semiconductor substrate 120. As described above, in the present specification, in order to clearly explain the design of the thermal dissipation structure 100, the optoelectronic integrated circuit is simply presented by the opto-electric component 210. In some embodiments, a larger number of integrated circuits are formed above the first surface 123, and a greater number of opto-electric components 210 are placed in the integrated circuit to be integrated, and the integrated circuits and the opto-electric components 210 form a complete opto-electronic integrated circuit. In some embodiments, the opto-electric component 210 is bonded to the first surface 123 via silver glue or gold-plated tin. Thus, when the photovoltaic element 210 operates and generates heat, an external pipe is provided to the inlet 143 and the outlet 146 of the thermal dissipation channel 140 to circulate the heat transfer fluid 190 to remove heat. For details, please refer to the description of FIG. 4B.

According to the flow chart illustrated by above-mentioned FIGS. 5A to 5G, it has been clearly explained a manufacturing process of the thermal dissipation structure 100 having the thermal dissipation channel 140. In another embodiment of the present disclosure, the heat dissipation channel of the heat dissipation structure can be directly filled with a solid heat conductive material, as shown in FIG. 6.

Figure 6:
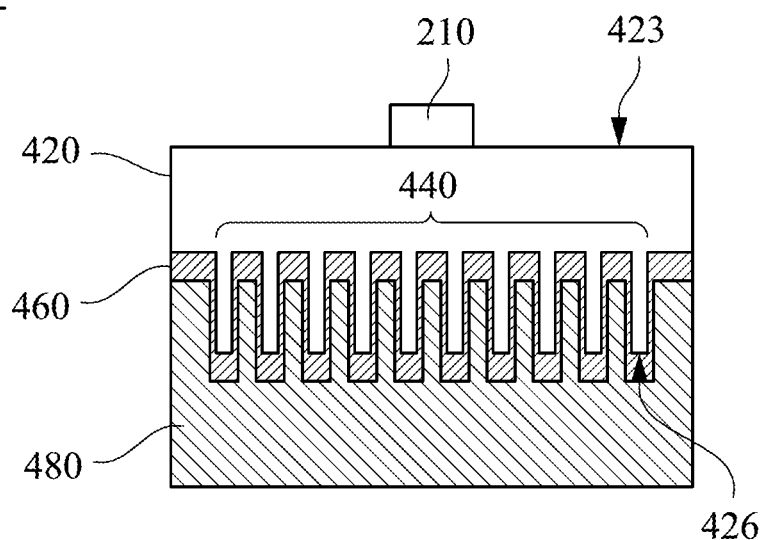
FIG. 6 illustrates a schematic cross section of a thermal dissipation structure according to other embodiments of the present disclosure.

FIG. 6 illustrates a schematic cross section of a thermal dissipation structure 400 according to other embodiments of the present disclosure. In FIG. 6, the thermal dissipation structure 400 includes a semiconductor substrate 420, a thermal dissipation trench 440, a metal seed layer 460, and a metal layer 480. The semiconductor substrate 420 has a first surface 423 and an opposite second surface 426, and the opto-electric component 210 representing the opto-electronic integrated circuit 200 is configured on the first surface 423 of the semiconductor substrate 420. The thermal dissipation trench 440 is formed on the second surface 426 of the semiconductor substrate 420 and is recessed from the second surface 426. In other words, the thermal dissipation trench 440 is formed within the semiconductor substrate 420. The metal seed layer 460 covers the second surface 426 of the semiconductor substrate 420 and the thermal dissipation trench 440, which in turn can directly connect the second surface 426 and the thermal dissipation trench 440 through the metal seed layer 460.

The thermal dissipation trench 440 is filled by the metal seed layer 460 and the metal layer 480. The metal layer 480 is an electroplated layer formed from the metal seed layer 440. Therefore, the thermal dissipation trench 440 of the thermal dissipation structure 400 do not have a heat transfer fluid flowing, and the heat dissipation function is achieved through the metal seed layer 460 and the metal layer 480. When the opto-electric component 210 operates to generate heat, the heat is transferred from the first surface 423 to the thermal dissipation trench 440 recessed from the second surface 426 and then to the metal seed layer 460 and the metal layer 480. The material of the metal layer 480 is, for example, copper, which has good thermal conductivity. In some embodiments, the thermal dissipation trench 440 is formed by a semiconductor patterning process. The thermal dissipation trench 440 has a finer distribution than the metal layer 480. To avoid damaging the pattern of the thermal dissipation trench 440, the metal layer 480 is connected to the thermal dissipation trench 440 through the metal seed layer 460, and the metal seed layer 460 and the metal layer 480 are filled in the thermal dissipation trench 440.

In summary, the present disclosure relates to a thermal dissipation structure including a thermal dissipation channel, and the thermal dissipation channel is directly formed within the semiconductor substrate on which the opto-electronic integrated circuit is disposed, so that the distance between the opto-electronic integrated circuit and the thermal dissipation channel can be minimized. When the opto-electronic integrated circuit operates and generates heat, a heat transfer fluid flows through the thermal dissipating channel, so that heat can be transferred to the heat transfer fluid at a close distance and carried out by the heat transfer fluid. When the heat transfer fluid circulates, the heat transfer fluid directly contacts the metal seed layer, and the heat is transferred through the metal seed layer and the metal layer connected to the metal seed layer. The metal seed layer and the metal layer use a metal having good thermal conductivity, so that heat transfer efficiency can be effectively improved. The use of the metal seed layer to connect the metal layer to the semiconductor substrate would not damage the trench portion of the thermal dissipation channel of the semiconductor substrate. In other embodiment of the present disclosure, a thermal dissipation structure includes a thermal dissipation trench, a metal having good thermal conductivity can be directly placed in the thermal dissipation trench, and the heat can be transferred at a close distance through the metal with good thermal conductivity.

The features of various embodiments are described above, and those skilled in the art can better understand the present disclosure in various aspects. Those skilled in the art can readily use the description as a basis for designing or modifying other processes and structures to achieve the same objectives or advantages as the embodiments described herein. Those skilled in the art should also understand that such an equivalent structure does not depart from the spirit and scope of the description. Without departing from the spirit and scope of this description, various changes, substitutions or modification can be made and included in the present disclosure.

What is claimed is:

1. A thermal dissipation structure used for integrated circuits, comprising:
   a semiconductor substrate having a first surface and a second surface opposite to the first surface, wherein the integrated circuits are disposed on and thermally coupled with the first surface;
   a thermal dissipation trench recessed from the second surface and within the semiconductor substrate;
   a metal seed layer formed on the second surface and covering the thermal dissipation trench on the second surface to define a hollow thermal dissipation channel, wherein the thermal dissipation channel comprises an inlet and an outlet on a side surface of the semiconductor substrate; and
   a metal layer being an electroplated layer formed from the metal seed layer.

2. The thermal dissipation structure of claim 1, wherein the semiconductor substrate comprises a silicon on insulator (SOI) substrate.

3. The thermal dissipation structure of claim 2, wherein the SOI substrate comprises a silicon layer and an insulating layer, a lower surface of the insulating layer defines the second surface and connected to the metal seed layer.

4. The thermal dissipation structure of claim 3, wherein the thermal dissipation trench is formed within the insulating layer and exposes the silicon layer.

5. The thermal dissipation structure of claim 1, wherein the thermal dissipation channel has an area on the second surface, the integrated circuits have a vertical projection on the second surface that is located in the area of the thermal dissipation channel.

6. The thermal dissipation structure of claim 1, wherein the thermal dissipation channel comprises a plurality of hollow channels, the hollow channels are parallel to and communicated to each other.

7. The thermal dissipation structure of claim 6, wherein a width of the inlet or the outlet of the thermal dissipation channel is greater or equal to a width of any of the hollow channels.

8. The thermal dissipation structure of claim 1, wherein the metal layer comprises copper.

9. The thermal dissipation structure of claim 1, further comprising a pipe group, wherein the pipe group has at least two pipes respectively communicated to the inlet and the outlet to inject heat transfer fluid into the thermal dissipation channel.

* * * * *